United States Patent [19]
Jones

[11] Patent Number: 5,945,876
[45] Date of Patent: Aug. 31, 1999

[54] SOFT SWITCHING FOR CARTESIAN FEEDBACK LOOP CONTROL WITH A TRANSMISSION SYSTEM

[75] Inventor: Mark Alan Jones, Forest, Va.

[73] Assignee: Ericsson Inc., Research Triangle Park, N.C.

[21] Appl. No.: 08/938,261

[22] Filed: Sep. 26, 1997

[51] Int. Cl.[6] .......................................................... H03F 1/34

[52] U.S. Cl. ............................... 330/51; 330/110; 455/126

[58] Field of Search .................................. 330/2, 51, 110, 330/149; 455/126

[56] References Cited

U.S. PATENT DOCUMENTS

| 5,559,468 | 9/1996 | Gailus et al. | 330/110 |
| 5,623,226 | 4/1997 | Whitmarsh et al. | 330/2 |

*Primary Examiner*—Steven J. Mottola
*Attorney, Agent, or Firm*—Jenkens & Gilchrist, P.C.

[57] ABSTRACT

A feedback circuit for use with a power amplifier is disclosed. A feedback circuit includes means for providing An inactive state wherein the input for the feedback circuit comprises an output of the loop filter operational amplifier and an active state wherein the input for the feedback circuit consists of a coupled, demodulated power amplifier output. A soft switching circuit is included for gradually switching between the inactive and active states, such that transient spikes are prevented within the feedback circuitry signal.

15 Claims, 2 Drawing Sheets

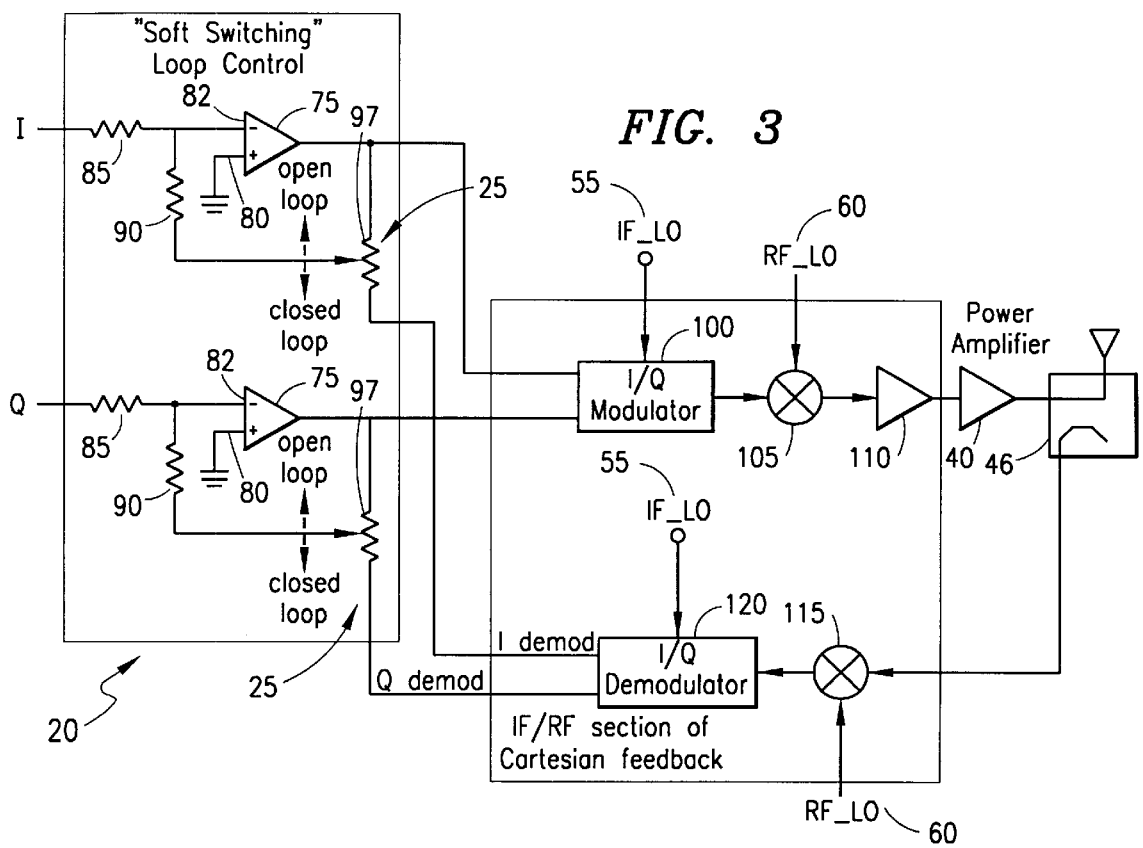
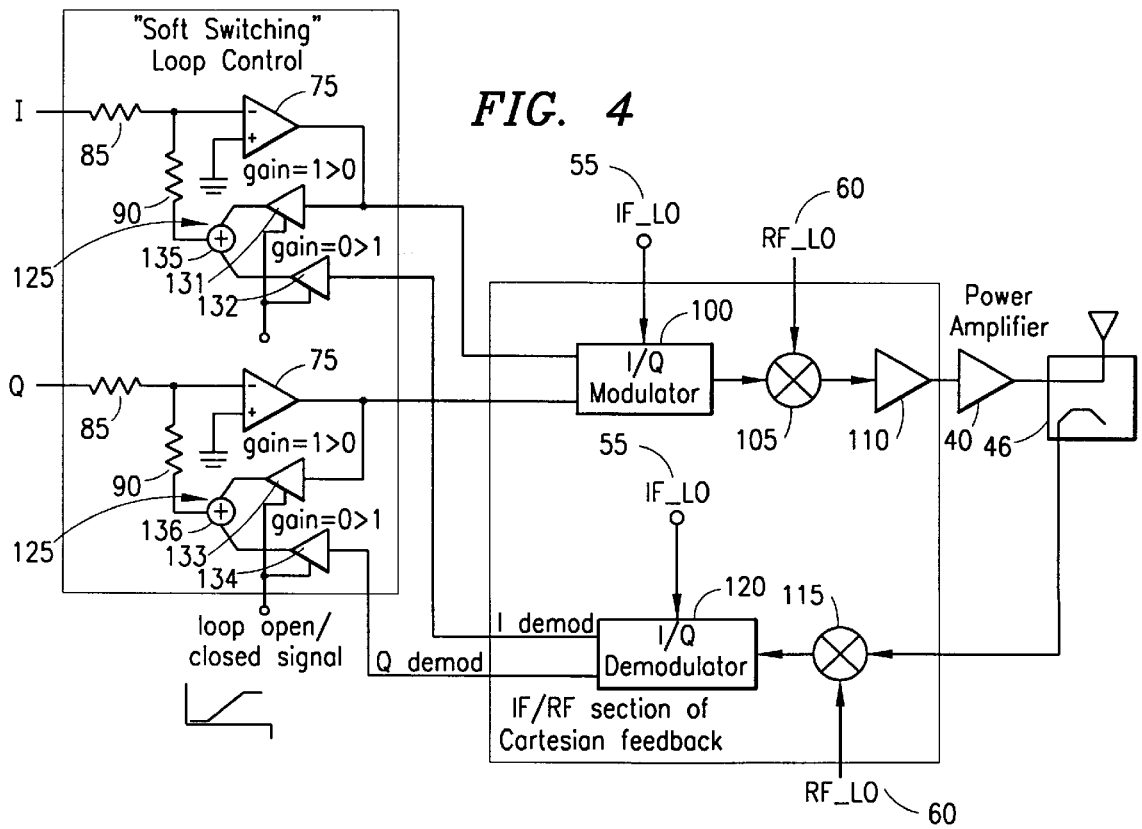

SOFT SWITCHING FOR CARTESIAN FEEDBACK LOOP CONTROL WITH A TRANSMISSION SYSTEM

BACKGROUND OF THE INVENTION

1. Technical Field of the Invention

The present invention relates to the use of a Cartesian feedback control system to achieve power amplifier linearization in transmitter systems using linear modulations, and more particularly, to the use of soft switching within a Cartesian feedback loop control system to prevent transient spikes in transmitter systems using linear modulation.

2. Description of Related Art

A Cartesian feedback control system is commonly used to achieve power amplifier linearization in transmitter systems using linear modulation schemes, such as quaduture phase shift keying (QPSK) or quaduture amplitude modulation (QAM). A typical Cartesian feedback loop includes some form of switching wherein the feedback signal for a connected loop amplifier is taken either directly from the loop amplifier output (during the open loop or inactive state) or from the coupled, demodulated power amplifier (PA) output (closed loop or active state).

The Cartesian feedback loop includes two states. Transitions between states are performed by hard switching of the feedback signal. Normally, the Cartesian feedback loop must be switched from the opened to the closed state (inactive to active state) sometime during the transmit cycle of a transmitter each time the attached loop power amplifier comes up to full power. Each time the Cartesian feedback loop is switched into the circuit, the feedback loop produces a transient spike in the feedback signal due to minute differences in amplitude and phase of the open loop and closed loop signals. The transient spike manifests itself as a glitch in the power amplifier output. The glitch may extend across a wide frequency spectrum and violate transient adjacent channel power constraints in many existing radio systems.

The problem is particularly difficult to deal with within a time division multiple access (TDMA) based architecture wherein the loop switching must be coincident with the start of each TDMA pulse. Present solutions for reducing or minimizing the effects of the transient glitch are achieved by closing/opening the loop only under low power conditions and/or temporarily disabling the antenna connection while the feedback loop is in transition. However, additional solutions for eliminating or minimizing the power glitch during feedback loop transitions without adversely affecting the operation of the transmitter are needed.

SUMMARY OF THE INVENTION

The present invention overcomes the foregoing and other problems with a feedback circuit for use with a power amplifier that includes soft switching capabilities. The feedback circuit includes first and second operational amplifiers each in a weighted summer configuration for receiving an input of the operational amplifier in an inactive state, and for receiving a coupled, demodulated power amplifier output signal in an active state. In response to either of the states, the first and second operational amplifiers generate in-phase and quadrature signals at baseband provided to the input of the I/Q modulator and ultimately controlling the output of the power amplifier.

Switching circuitry associated with the first and second operational amplifiers allows a gradual switching between the inactive and active states such that transient spikes are not generated within the feedback circuitry. The switching circuitry will normally effectuate the switching in a time frame of approximately 10 to 500 microseconds. Various components may be used to create the switching circuitry such as a potentiometer, FET-based impedance control switch or current steering circuitry. Additional components within the Cartesian feedback circuit provide for conversion and modulation of signals between the operational amplifier and the output of the power amplifiers.

BRIEF DESCRIPTION OF THE DRAWINGS

For a more complete understanding of the present invention, reference is made to the following detailed description taken in conjunction with the accompanying drawings wherein:

FIG. 3 is a schematic diagram of a first implementation of the Cartesian feedback loop circuitry including soft switching; and FIG. 4 is a schematic diagram of a second embodiment of the Cartesian feedback loop circuitry including soft switching.

DETAILED DESCRIPTION OF THE INVENTION

Figure 1:
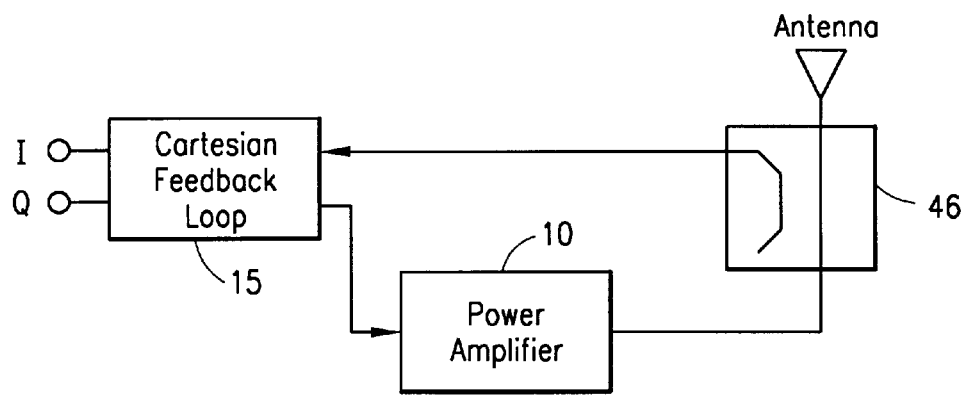
FIG. 1 is a block diagram of an interconnected power amplifier circuit and Cartesian feedback loop circuit.

Referring now to the drawings, and more particularly to FIG. 1, there is illustrated a block diagram of a power amplifier circuit 10 interconnected with a Cartesian feedback loop circuit 15. The Cartesian feedback loop circuit 15 is used to linearize the output of the power amplifier circuit in transmitter systems utilizing linear quadrature (I/Q) modulation.

Figure 2:
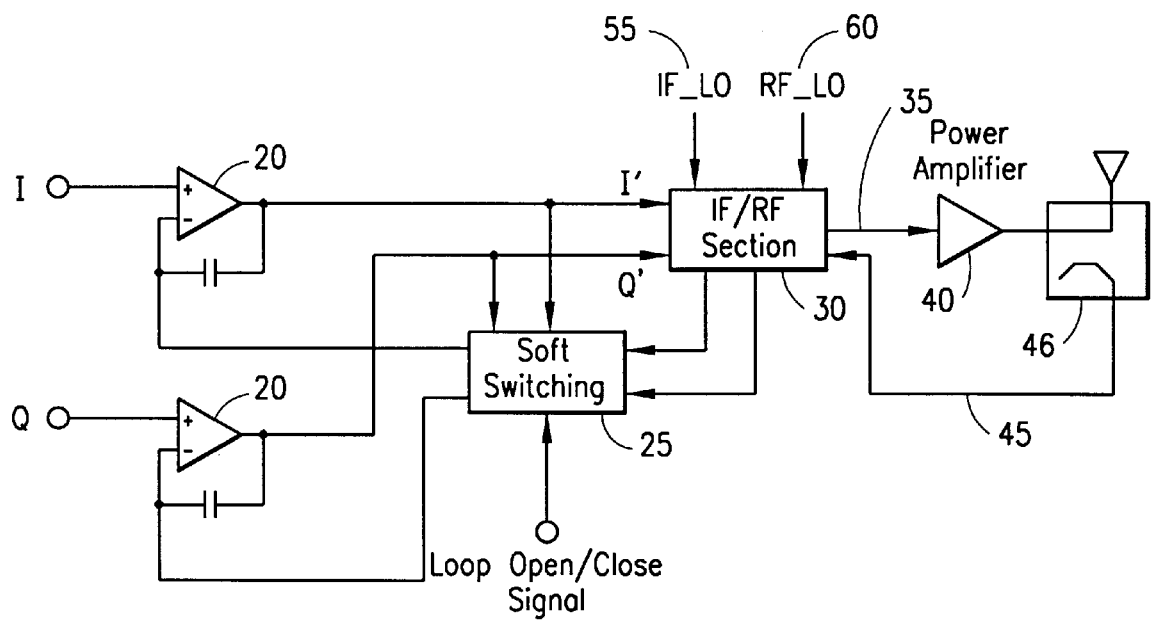
FIG. 2 is a block diagram of a soft switching mechanism implemented within the Cartesian feedback loop circuitry.

Referring now also to FIG. 2, there is illustrated a block diagram of the Cartesian feedback loop circuit 15 including the soft switching circuitry 25 of the present invention. The Cartesian feedback loop circuit 15 consists of the loop filters 20, the soft switching circuitry 25 and the IF/RF section 30. The soft switch circuitry 25 provides for a gradual switching transitions between a closed loop and an open loop state to prevent the transient glitch in the power amplifier circuit output. In a preferred embodiment switching between states is performed in a length of time greater than or equal to the settling time of the loop filters 20. The soft switching section 25 controls the state of the Cartesian feedback section (either open or closed loop) as follows. In an open loop state, the outputs of the I and Q loop filters 20 (or on attenuated version thereof) are passed to the negative input of the I and Q loop filters 20, respectively. This causes the loop filters 20 to act as simple fixed gain amplifiers. In a closed loop state, the soft switching section 25 passes the demodulated I and Q signals (or an attenuated version) to the negative input of the I and Q loop filters 20, respectively. This causes any error signals on the demodulated I and Q signals to be inverted and amplified by the loop filters 20 and thus canceled at the power amplifier output, as is done in any Cartesian feedback system. The novel point of this architecture is that the soft switching section 25 performs a gradual fade between states rather than a sharp delineation between open and closed loop conditions.

The IF/RF section 30 of the Cartesian feedback loop circuit 15 provides for intermediate frequency and radio frequency modulation/demodulation of the I/Q and power amplifier 10 output signals. The RF output line 35 provides an RF output to the power amplifier input 40. The RF input line 45 provides an RF input from the power amplifier coupler 46. IF and RF modulation and mixing are carried out in response to an intermediate frequency local oscillator signal input 55 and an (optional) RF frequency local oscillator signal input 60.

Referring now to FIG. 3, there is illustrated in more detail a schematic diagram of a first embodiment of the loop control switch 20 and IF/RF section 30 of the Cartesian feedback loop circuit 15. The loop filters 20 and the soft switch 25 is comprised of two operational amplifiers 75 each in a weighted summer configuration with the positive inputs 80 of the operational amplifiers connected to ground, and the negative inputs 82 connected to a parallel combination of a first resistor 85 connected to the real and imaginary portion of the loop power amplifier outputs 50 and a second resistor 90 connected to the coupled, demodulated power amplifier output from the IF/RF section 30. This configuration provides a weighted sum of the loop amplifier output 50 and the coupled, demodulated power amplifier output to the negative inputs 82 of the operational amplifiers 75.

During the inactive state, the loop amplifier output 50 is primary connected to the negative inputs 82 of the operational amplifiers 75 through resistor 85. During the active state the coupled, demodulated power output is provided to negative inputs 82 of the operational amplifiers 75. Switching between the two states is enabled via the soft switching circuitry 25. The soft switching circuitry 25 enables a smooth transition by slowly changing the weighted sum presented to the negative inputs of the loop amplifiers 75. The switching speed is defined as a speed slower than the closed loop bandwidth of the Cartesian feedback loop but faster than the TDMA signal ramp-up and ramp-down times.

FIG. 3 illustrates the use of a potentiometer 97 to enable this smooth transition between states, however it should be realized that a FET-base impedance control switch, a current steering circuit or other types of circuitry may be used to achieve the smooth switching transition. As a result of the gradual transition between the active and inactive states (closed loop and open loop states), a transient pulse within the power amplifier output is averted as long as the transition is performed at a rate slower than the settling time of the Cartesian feedback loop and faster than the TDMA burst ramp-up and ramp-down times. Typically, the settling time of the Cartesian feedback loop would be around 1 to 10 microseconds. The typical TDMA burst ramp-up and ramp-down times would be roughly 500 microseconds. Thus, a transition time between 10 microseconds and 500 microseconds would provide a mechanism useful for controlling the linearization loop of a TDMA type transmitter.

The outputs of the operational amplifiers 75 are connected to the I/Q modulator 100 of the IF/RF section 30 wherein the I and Q input data signals are modulated to IF frequency in response to the intermediate frequency local oscillator signal input 55. The intermediate frequency signal is then mixed with the RF local oscillator signal 60 at mixer 105 to produce an upconverted RF signal. The RF signal is amplified by an amplifier 110 and output to the power amplifier 40. An RF input signal is received from the power amplifier coupler 46 and down converted to IF in mixer 115 in response to the RF local oscillator signal 60. The IF signal is then demodulated at I/Q demodulator 120 in response to the intermediate frequency local oscillator signal input 55. The I (in-phase) and Q (quadrature-phase) components the demodulated signal are provided to the negative inputs 82 of the operational amplifiers 75 in the manner discussed previously.

Referring now to FIG. 4, there is illustrated an alternative embodiment of the present invention wherein the soft switching circuitry 25 consists of a weighted summer circuit 125. The weighted summer circuit 125 smoothly switches between the active and inactive states by gradually adjusting the weighted sum applied to the negative input of operational amplifier 75. The weighted sum can be performed by a current steering network, variable gain amplifiers, or other similar means. The gains of the weighted sum amplifiers 130 are given by the following equations in response to an input control signal X (signal X is normalized such that X=0 represents open loop, and X=1 represents closed loop states).

Amplifiers 131,133: Gain=(1−X)

Amplifiers 132,134: Gain=X

The outputs of the amplifiers 131,132 and 133,134 are routed through summing blocks 135 and 136. These summing blocks produce an output signal governed by the following equations.

Output of summer 135=a(output of amplifier 131)+b (Output of amplifier 132)

Output of summer 136=a(Output of amplifier 133)+b (Output of amplifier 134)

Where a and b are fixed constants chosen for stable feed back operation. The net effect of the weighted sum amplifiers 130 and the summing blocks 135, 136 is given by the following equations which determine the feedback signals applied to the negative input of the loop filters 75.

feedback signal from summer 135=a(1−X)(I fnd) +b(X)(I demod)

feedback signal from summer 136=a(1−X)(Q fnd) +b(X)(Q demod)

Feedback signals 140 and 141 are applied to the negative inputs of op amps 75 and 76 through resistors 90 and 91.

The remainder of the circuit is configured in the same manner as the embodiment of FIG. 3.

The present invention makes it possible to eliminate power glitches normally associated with the opening and closing of a feedback loop in Cartesian feedback linearization systems. This improvement enables easier production of a TDMA compatible transmitter which meets the transient adjacent channel power requirements. The invention would also decrease transmitter complexity and costs by eliminating the need for extra power ramp-up circuitry, antenna switches, or other means for reducing the impact of transient bursts created during TDMA cycling. Additionally, channel through-put may be increased since a linearization warm up time would no longer need to be added to a TDMA frame.

Although preferred embodiments of the method and apparatus of the present invention have been illustrated in the accompanying Drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A feedback circuit for use with a power amplifier, comprising:

means for providing an inactive state wherein an input for the feedback circuit is coupled to an output of the power amplifier and an active state wherein the input for the feedback circuit is coupled to a coupled, demodulated power amplifier output; and a variable gain weighted summer circuit for gradually switching between the inactive and active states to prevent transient spikes from the power amplifier output.

2. The feedback circuit of claim 1 wherein the means for providing comprises:

first and second operational amplifiers, each in a weighted summer configuration, for receiving the output of the operational amplifiers in the inactive state and for receiving the coupled, demodulated power amplifier output in the active state and for outputting a feedback signal;

first means for converting the feedback signal to an RF output signal; and second means for converting a modulated power amplifier output signal to the coupled, demodulated power amplifier output signal.

3. The feedback circuit of claim 2 wherein the first means for converting comprises:

a quadrature modulator for modulating the feedback signal to an intermediate frequency signal;

a mixer for upconverting the intermediate frequency signal to the RF signal; and an amplifier for amplifying the RF signal.

4. The feedback circuit of claim 2 wherein the second means for converting comprises:

a mixer for downconverting the coupled, modulated power amplifier output signal to an IF signal; and a demodulator for demodulating the IF signal to the baseband I and Q signals.

5. The feedback circuit of claim 2 wherein the first means for converting comprises:

a quadrature modulator for modulating the feedback signal to the RF signal; and an amplifier for amplifying the RF signal.

6. The feed back circuit of claim 2 wherein the second means for converting comprises a demodulator for demodulating the coupled, modulated power amplifier output signal to baseband I and Q signals.

7. The feedback circuit of claim 1 wherein the circuitry for gradually switching switches between states substantially within the range of 10 microseconds–500 microseconds.

8. A feedback circuit for use with a power amplifier, comprising:

first and second operational amplifiers, each in a weighted summer configuration, for receiving an output of the operational amplifiers in an inactive state, for receiving a coupled, demodulated power amplifier output in an active state, and for generating a feedback signal in response to the inputs;

a variable gain weighted summer circuit for gradually switching between the inactive and active states to prevent transient spikes within the feedback circuit; and means for frequency converting signals between the first and second operational amplifiers and the power amplifier.

9. The feedback circuit of claim 8 wherein the means for frequency converting comprises:

first means for converting the feedback signal to an RF output signal; and second means for converting a coupled, modulated power amplifier output signal to the coupled, demodulated power amplifier output signal.

10. The feedback circuit of claim 9 wherein the first means for converting comprises:

a modulator for modulating the feedback signal to an intermediate frequency signal;

a mixer for upconverting the intermediate frequency signal to the RF signal; and an amplifier for amplifying the RF signal.

11. The feedback circuit of claim 10 wherein the second means for converting comprises:

a mixer for downconverting the coupled, modulated power amplifier output signal to an IF signal; and a demodulator for demodulating the IF signal to baseband I and Q signals.

12. The feedback circuit of claim 11 wherein the circuitry for gradually switching switches between states substantially within the range of 10 microseconds–500 microseconds.

13. A linearized power amplifier circuit comprising:

a power amplifier having an output and an input; and feedback circuitry connected between the output and the input of the power amplifier, the feedback circuit using a variable gain weighted summer circuit to gradually switch between active and inactive states such that transient spikes are not generated by the feedback circuitry.

14. The linearized power amplifier of claim 13 wherein the feedback circuitry further comprises:

first and second operational amplifiers, each in a weighted summer configuration, for receiving an output of the operational amplifiers in an inactive state, for receiving coupled, demodulated in-phase and quadrature power amplifier outputs in an active state, and for generating a feedback signal in response to the inputs;

circuitry for gradually switching between the inactive and active states to prevent transient spikes within the feedback circuit; and means for frequency converting signals between the first and second operational amplifiers and the power amplifier.

15. The feedback circuit of claim 8 wherein the circuitry for gradually switching switches between states substantially within the range of approximately 10 microseconds–500 microseconds.

* * * * *